United States Patent
Chang et al.

(10) Patent No.: US 8,436,257 B2
(45) Date of Patent: May 7, 2013

(54) ELECTROMAGNETIC SHIELDING ARTICLE AND METHOD FOR MANUFACTURING SAME

(75) Inventors: Hsin-Pei Chang, Tu-Cheng (TW); Wen-Rong Chen, Tu-Cheng (TW); Huann-Wu Chiang, Tu-Cheng (TW); Cheng-Shi Chen, Tu-Cheng (TW); Chuang Ma, Shenzhen (CN)

(73) Assignees: Hong Fu Jin Precision Industry (ShenZhen) Co., Ltd., Shenzhen (CN); Hon Hai Precision Industry Co., Ltd., New Taipei (TW)

( * ) Notice: Subject to any disclaimer, the term of this patent is extended or adjusted under 35 U.S.C. 154(b) by 305 days.

(21) Appl. No.: 13/032,725

(22) Filed: Feb. 23, 2011

(65) Prior Publication Data
US 2012/0118625 A1 May 17, 2012

(30) Foreign Application Priority Data
Nov. 11, 2010 (CN) .......................... 2010 1 0539837

(51) Int. Cl.
*H05K 9/00* (2006.01)
(52) U.S. Cl.
USPC ............ 174/386; 174/388; 427/452; 427/404
(58) Field of Classification Search ................... 174/386, 174/388; 361/816, 818; 427/452, 404
See application file for complete search history.

(56) References Cited

U.S. PATENT DOCUMENTS

| | | | |
|---|---|---|---|
| 6,686,536 B2 * | 2/2004 | Tone et al. ..................... | 174/389 |
| 6,713,671 B1 * | 3/2004 | Wang et al. ..................... | 174/391 |
| 2004/0020673 A1 * | 2/2004 | Mazurkiewicz .............. | 174/350 |
| 2004/0256131 A1 * | 12/2004 | Wang et al. .................... | 174/350 |
| 2009/0159328 A1 * | 6/2009 | Dai et al. ....................... | 174/350 |

* cited by examiner

*Primary Examiner* — Hung Ngo
(74) *Attorney, Agent, or Firm* — Altis Law Group, Inc.

(57) ABSTRACT

An electromagnetic shielding article includes a plastic substrate, a silicon dioxide layer deposited on the plastic substrate, an electromagnetic shielding layer deposited on the plastic substrate, and a protection layer deposited on the electromagnetic shielding layer.

16 Claims, 1 Drawing Sheet

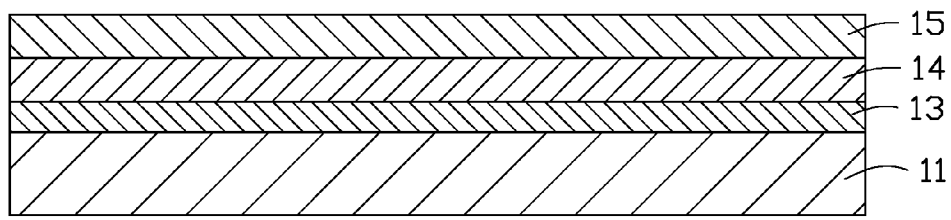

ELECTROMAGNETIC SHIELDING ARTICLE AND METHOD FOR MANUFACTURING SAME

CROSS-REFERENCE TO RELATED APPLICATIONS

The present application is related to co-pending U.S. patent application Ser. Nos. 13/032,724 and 13/032,728, each entitled "ELECTROMAGNETIC SHIELDING ARTICLE AND METHOD FOR MANUFACTURING SAME", by Zhang et al. These applications have the same assignee as the present application and have been concurrently filed herewith. The above-identified applications are incorporated herein by reference.

BACKGROUND

1. Technical Field

The exemplary disclosure generally relates to electromagnetic shielding articles and methods for manufacturing the electromagnetic shielding articles.

2. Description of Related Art

The operation of portable electronic devices such as mobile telephone, televisions, radios, computers, medical instruments, business machines, communications equipment, and the like generates electromagnetic radiation within the electronic circuitry of the equipment, and is termed "electromagnetic interference" or "EMI". EMI is known to interfere with the operation of other nearby electronic devices.

To attenuate EMI effects, shielding can having the capability of absorbing and/or reflecting EMI energy may be employed to confine the EMI energy within a source device, and to insulate that device or other "target" devices from other source devices. A typical shielding may comprise a plastic substrate and an electrically-conductive layer coated on the plastic substrate. However, it is difficult to coat an electrically-conductive layer on a plastic substrate.

Therefore, there is room for improvement within the art.

BRIEF DESCRIPTION OF THE DRAWINGS

Many aspects of the embodiments can be better understood with reference to the following drawings. The components in the drawings are not necessarily drawn to scale, the emphasis instead being placed upon clearly illustrating the principles of the exemplary electromagnetic shielding article and method for manufacturing the electromagnetic shielding article. Moreover, in the drawings like reference numerals designate corresponding parts throughout the several views. Wherever possible, the same reference numbers are used throughout the drawings to refer to the same or like elements of an exemplary embodiment.

The FIGURE is a cross-sectional view of an exemplary embodiment of an electromagnetic shielding article.

DETAILED DESCRIPTION

Referring to FIGURE, an exemplary embodiment of an electromagnetic shielding article 10 includes a plastic substrate 11, a silicon dioxide (SiO2) layer 13 deposited on the plastic substrate 11 by radio-frequency induction plasma spraying process, an electromagnetic shielding layer 14 deposited on the silicon dioxide layer 13 by magnetron sputtering process, and a protection layer 15 deposited on the electromagnetic shielding layer 14 by magnetron sputtering process.

The silicon dioxide layer 13 has a thickness between about 800 nanometers and about 1200 nanometers. The silicon dioxide molecule in the silicon dioxide layer 13 can react with atomic oxygen in the plastic substrate 11 to form chemical bond with high energy, so the silicon dioxide layer 13 can be firmly deposited on the plastic substrate 11. Additionally, the silicon dioxide layer 13 is hard, and will not allow the plastic substrate 11 to be easily deformed. Thus, the silicon dioxide layer 13 can prevent the electromagnetic shielding layer 14 and the protection layer 15 from being damaged and losing shielding functionality.

The electromagnetic shielding layer 14 is made of metal, such as copper and/or silver. The electromagnetic shielding layer 14 has a thickness between about 0.2 micrometers and about 2.0 micrometers. The copper and the silver have a low resistivity, so the electromagnetic shielding layer 14 made from the copper and the silver provides effective electromagnetic shielding.

The protection layer 15 improves the corrosion resistance of the electromagnetic shielding article 10. In this exemplary embodiment, the protection layer 15 is a stainless steel layer and has a thickness between about 0.5 micrometers and about 1.5 micrometers. The protection layer 15 can improve the corrosion resistance of the electromagnetic shielding article 10, to further prevent losing electromagnetic shielding functionality.

A method for manufacturing the electromagnetic shielding article 10 may include at least the following steps.

A plastic substrate 11 is provided. The plastic substrate 11 may be made of plastic, such as polyvinyl chloride, polyethylene, polystyrene, polypropylene, polycarbonate, cellulose nitrate, phenol-formaldehyde, polyurethane, epoxide resin, by injection molding process.

A vacuum coating machine (not shown) is provided. The vacuum coating machine may include a plasma cleaning chamber, a radio-frequency induction plasma spraying chamber, a first metal spraying chamber, a second metal spraying chamber, a transport device and a rotating bracket mounted on the transport device.

The plastic substrate 11 is cleaned by argon plasma cleaning. The plastic substrate 11 is retained on the rotating bracket, and then is moved into the plasma cleaning chamber. The vacuum level inside the plasma cleaning chamber is set to 5.0×10−3 Pa, pure argon is floated into the plasma cleaning chamber at a flux of about 90 standard cubic centimeters per minute (sccm) to 270 sccm, and an ion source in the plasma cleaning chamber is started at a power from about 700 w to about 900 w for about 1 minutes to about 10 minutes, to produce argon ions. The argon ions are then emitted onto the plastic substrate 11, which washes the plastic substrate 11, removing pollutants such as grease or dust.

A silicon dioxide layer 13 is deposited on the plastic substrate 11 by radio-frequency induction plasma spraying process. The substrate 11 is moved into the radio-frequency induction plasma spraying chamber by the transport device, and in this exemplary embodiment, the speed of the transport device is about 0.1 meters per second (m/s) to 0.5 m/s. The argon is floated into the radio-frequency induction plasma spraying chamber at a flux from about 100 sccm to 300 sccm, and in this exemplary embodiment is at about 150 sccm. The temperature inside the radio-frequency induction plasma spraying chamber is heated to 50 to 150° C. A silicon dioxide target in the radio-frequency induction plasma spraying chamber is evaporated at a power from about 2 kW to about 7 kW, to deposit the silicon dioxide layer 13 on the plastic substrate 11.

An electromagnetic shielding layer 14 is deposited on the silicon dioxide layer 13 by magnetron sputtering process. The substrate 11 is moved into the first metal spraying chamber by the transport device, and in this exemplary embodiment, the speed of the transport device in this step is also about 0.1 meters per second (m/s) to 0.5 m/s. The temperature inside the first metal spraying chamber is set to 50~150° C. Argon is floated into the first metal spraying chamber at a flux from about 75 sccm and about 150 sccm. A copper or silver target in the first metal spraying chamber is evaporated at a power from 1 kW to 10 kW, to deposit the electromagnetic shielding layer 14 on the silicon dioxide layer 13.

A protection layer 15 is deposited on the electromagnetic shielding layer 14 by magnetron sputtering process. The substrate 11 is moved into the second metal spraying chamber by the transport device, and in this exemplary embodiment, the speed of the transport device again, is about 0.1 meters per second (m/s) to 0.5 m/s. The temperature inside the second metal spraying chamber is set to 50~150° C. Argon is floated into the second metal spraying chamber at a flux from about 75 sccm to about 150 sccm. A stainless steel target in the second metal spraying chamber is evaporated at a power from 1 kW to 10 kW, to deposit the protection layer 15 on the electromagnetic shielding layer 14. The copper and the silver have low resistivity, so the electromagnetic shielding layer 14 made from the copper and the silver provides effective electromagnetic shielding.

It is to be understood, however, that even through numerous characteristics and advantages of the exemplary disclosure have been set forth in the foregoing description, together with details of the system and function of the disclosure, the disclosure is illustrative only, and changes may be made in detail, especially in matters of shape, size, and arrangement of parts within the principles of the disclosure to the full extent indicated by the broad general meaning of the terms in which the appended claims are expressed.

What is claimed is:

1. An electromagnetic shielding article, comprising:
   a plastic substrate;
   a silicon dioxide layer deposited on the plastic substrate;
   an electromagnetic shielding layer deposited on the silicon dioxide layer; and
   a protection layer deposited on the electromagnetic shielding layer.

2. The electromagnetic shielding article as claimed in claim 1, wherein the silicon dioxide layer is deposited on the plastic substrate by radio-frequency induction plasma spraying process and has a thickness between about 800 nanometers and about 1200 nanometers.

3. The electromagnetic shielding article as claimed in claim 1, wherein the electromagnetic shielding layer is made of metal.

4. The electromagnetic shielding article as claimed in claim 3, wherein the metal is copper or silver.

5. The electromagnetic shielding article as claimed in claim 1, wherein the electromagnetic shielding layer has a thickness between about 0.2 micrometers and about 2.0 micrometers.

6. The electromagnetic shielding article as claimed in claim 1, wherein the protection layer is a stainless steel layer.

7. The electromagnetic shielding article as claimed in claim 6, wherein the protection layer has a thickness between about 0.5 micrometers and about 1.5 micrometers.

8. A method for manufacturing an electromagnetic shielding article comprising steps of:
   providing a plastic substrate;
   depositing a silicon dioxide layer on the plastic substrate;
   depositing an electromagnetic shielding layer on the silicon dioxide layer; and
   depositing a protection layer on the electromagnetic shielding layer.

9. The method of claim 8, wherein depositing the silicon dioxide layer is done by radio-frequency induction plasma spraying process.

10. The method of claim 9, wherein during depositing the silicon dioxide layer on the plastic substrate, the plastic substrate is retained in a radio-frequency induction plasma spraying chamber, argon is floated into the radio-frequency induction plasma spraying chamber at a flux from about 100 sccm to 300 sccm; the temperature inside of the radio-frequency induction plasma spraying chamber is heated to 50 to 150° C.; a silicon dioxide target in the radio-frequency induction plasma spraying chamber is evaporated at a power from about 2 kW to about 7 kW, to deposit the silicon dioxide layer on the plastic substrate.

11. The method of claim 9, wherein during depositing the electromagnetic shielding layer on the silicon dioxide layer, the plastic substrate is retained in a first metal spraying chamber, the temperature inside the first metal spraying chamber is set to 50~150° C.; argon is floated into the first metal spraying chamber at a flux from about 75 sccm to about 150 sccm; a copper or silver target in the first metal spraying chamber is evaporated at a power from 1 kW to 10 kW, to deposit the electromagnetic shielding layer on the silicon dioxide layer.

12. The method of claim 9, wherein during depositing the protection layer on the electromagnetic shielding layer, the plastic substrate is retained in a second metal spraying chamber, the temperature inside the second metal spraying chamber is set to 50~150° C.; argon is floated into the second metal spraying chamber at a flux from about 75 sccm to about 150 sccm; a stainless steel target in the second metal spraying chamber is evaporated at a power from 1 kW to 10 kW, to deposit the protection layer on the electromagnetic shielding layer.

13. The method of claim 9, further including a step of cleaning the plastic substrate by argon plasma cleaning between providing a plastic substrate and depositing the silicon dioxide layer on the plastic substrate.

14. The method of claim 13, wherein during cleaning the plastic substrate, the plastic substrate is retained in a plasma cleaning chamber, the vacuum level inside the plasma cleaning chamber is set to $5.0 \times 10^{-3}$ Pa, pure argon is floated into the plasma cleaning chamber at a flux of about 90 sccm to 270 sccm, and an ion source in the plasma cleaning chamber is started at a power from about 700 w to about 900 w for about 1 minutes to about 10 minutes, to clean the plastic substrate.

15. The method of claim 8, wherein the plastic substrate is made of plastic.

16. The method of claim 15, wherein the plastic is polyvinyl chloride, polyethylene, polystyrene, polypropylene, polycarbonate, cellulose nitrate, phenol-formaldehyde, polyurethane, or epoxide resin.

* * * * *